(12) United States Patent
Goel et al.

(10) Patent No.: US 7,545,180 B2
(45) Date of Patent: Jun. 9, 2009

(54) SENSE AMPLIFIER PROVIDING LOW CAPACITANCE WITH REDUCED RESOLUTION TIME

(75) Inventors: Ankur Goel, Karnal (IN); Mudit Bhargava, Noida (IN); Shishir Kumar, Gorakhpur (IN)

(73) Assignee: STMicroelectronics PVT. Ltd., Greater Noida (IN)

( * ) Notice: Subject to any disclaimer, the term of this patent is extended or adjusted under 35 U.S.C. 154(b) by 48 days.

(21) Appl. No.: 11/861,924

(22) Filed: Sep. 26, 2007

(65) Prior Publication Data

US 2008/0143390 A1 Jun. 19, 2008

(30) Foreign Application Priority Data

Sep. 26, 2006 (IN) .................. 2129/DEL/2006

(51) Int. Cl.
*G01R 19/00* (2006.01)
(52) U.S. Cl. ........................... 327/57; 327/52
(58) Field of Classification Search ............. 327/50–52, 327/56, 57, 63–65
See application file for complete search history.

(56) References Cited

U.S. PATENT DOCUMENTS 5,508,644 A * 4/1996 Branson et al. ............... 327/51
5,903,171 A * 5/1999 Shieh ........................... 327/55
6,137,319 A * 10/2000 Krishnamurthy et al. ...... 327/57
7,173,457 B2 * 2/2007 Kawasumi ................... 327/55
7,263,016 B1 * 8/2007 Palumbo et al. ............. 365/205

* cited by examiner

*Primary Examiner*—Lincoln Donovan
*Assistant Examiner*—Hai L. Nguyen
(74) *Attorney, Agent, or Firm*—Gardere Wynne Sewell LLP

(57) ABSTRACT

A sense amplifier circuit provides for high speed sensing with a high speed read operation, with a low capacitance and a low resolution time. The sense amplifier circuit includes a latch circuit having a first inverter circuit and a second inverter circuit cross coupled with each other. The amplifier circuit includes a first discharge device and a second discharge device operatively coupled to the first inverter circuit and the second inverter circuit respectively. The amplifier circuit further includes a first PMOS transistor operatively coupled between the first discharge device and a bit line, and a second PMOS transistor operatively coupled between the second discharge device and a complementary bit line. The amplifier circuit further includes a first NMOS transistor operatively coupled between the first discharge device and a ground voltage, a second NMOS transistor operatively coupled between the second discharge device and the ground voltage. The amplifier further includes a pull down circuit and a delay circuit. The delay circuit produces delay between two control signals. The circuit includes a first NOT gate and a second NOT gate operatively coupled to a first latch output node and a second latch output node respectively to provide an output data corresponding to a data stored in a memory cell.

20 Claims, 6 Drawing Sheets

SENSE AMPLIFIER PROVIDING LOW CAPACITANCE WITH REDUCED RESOLUTION TIME

PRIORITY CLAIM

The present application claims priority from Indian Patent Application No. 2129/Del/2006 of the same title filed Sep. 26, 2006, the disclosure of which is hereby incorporated by reference.

BACKGROUND

1. Technical Field

This invention relates to memory devices and more specifically to a sense amplifier providing a high speed sensing with high speed read operations in static random access memory (SRAM) circuits.

2. Description of Related Art

In an integrated memory circuit, a sense amplifier is used to improve the speed of a memory and to provide signals, which conform to the requirements of driving peripheral circuits within the memory. Due to large arrays of SRAM cells, a resulting signal of a read operation has a low voltage swing (on the order of few tens of millivolts). The sense amplifier is used to sense this small swing and provide the corresponding full rail-to-rail voltages. The sense amplifier senses the difference between a true bit line and a complimentary bit line during a read operation and amplifies the difference, so that the resulting signal will have a swing width from a ground voltage to a supply voltage.

FIG. 1 illustrates a general configuration for an SRAM column. The SRAM column includes 'N' number of rows in one column. During a read cycle, one of the N word lines goes high and a corresponding memory cell discharges a bit line (if logic '0' is stored in the memory cell) or a complementary bit line (if logic '1' is stored in the memory cell). When a sufficient voltage difference is created between the true bit line and the complementary bit line, the sense amplifier is enabled, the voltage difference is amplified and an output data is generated corresponding to a data stored in the memory cell.

FIG. 2 illustrates a circuit diagram 200 for a conventional cross-coupled latch type sense amplifier. It consists of two PMOS transistors MP1 and MP2 and two NMOS transistors MN1 and MN2 connected between a true bit line and a complementary bit line BITIO and BITBIO. The transistors MP1 and MN1 and the transistors MP2 and MN2 are individually connected to form two invertors. The two invertors are cross coupled to form a latch circuit. The sense amplifier also consists of two PMOS transistors MP3 and MP4, with one terminal connected to the bit line, the other terminal connected to the latch output node. A gate terminal of each transistor receives a control signal SAEN1. The transistors MP3 and MP4 transfer a resulting signal of a read operation from the bit lines to the cross coupled latch nodes INP and INN in response to the control signal SAEN1. The NMOS transistor MN3 is configured to provide a ground voltage to the cross coupled latch in response to the control signal SAEN1, with its drain connected to the latch and its source connected to ground (GND). The gate terminal of the MN3 also receives the control signal SAEN1.

The true and complimentary bit lines BITIO and BITBIO are supplied with a true and a complementary data signals from the memory cells. The control signal SAEN1 is kept at a logic low causing the PMOS transistors MP3 and MP4 to conduct and thereby passing on the swing generated by the memory cell to the latch. The SAEN1 control signal is then transitioned to logic high, causing a supply voltage VDD and the ground GND to be connected to the latch. One of the voltages transferred from the bit lines and having a higher value would cause one of the NMOS transistors MN1 or MN2 to conduct more than the other. The transistor that conducts less (MN1 or MN2) will have a lesser voltage at the drain terminal in comparison to the other NMOS transistor in the latch circuit. As a result, one of transistor MP1 or MP2 will conduct. Decreasing the rate of fall of the slower transistor further eventually brings it into a cut off state. The PMOS itself will move into a saturation region of operation. Then, the junction nodes of INP and INN will be placed at two extremes of the supply voltage, i.e., one is pulled up to the supply voltage VDD and the other is pulled down to the ground voltage GND, depending on the value of the data signals received from the memory cells. This value is fed to an inverter, which further amplifies the signal and provides the output. Thus, the cross coupled latch sense amplifier amplifies the true and the complementary data signals by a difference (VDD-GND), where VDD is a supply voltage and GND is a ground voltage.

However, the cross coupled latch sense amplifier imposes a very high capacitance on the bit lines and thereby slows down the discharge rate. Therefore, the read operation will be slower. To overcome this problem, alpha-latch type sense-amplifier have been proposed.

FIG. 3 illustrates a circuit diagram 300 of a conventional alpha type latch sense amplifier. The amplifier consists of two PMOS transistors MP1 and MP2 and two NMOS transistors MN1 and MN2 connected between true and complementary bit lines BITIO and BITBIO. The transistors MP1 and MN1 and the transistors MP2 and MN2 are individually connected to form two invertors. The two invertors are cross coupled so as to form a latch. Two NMOS transistors MN3 and MN4 have their drains connected to sources of the NMOS transistors MN1 and MN2, and their sources connected to the drain of an NMOS transistor MN5. The gates of MN3 and MN4 are connected to the bit lines BITIO and BITBIO. The transistor MN5 has its drain connected to the transistors MN3 and MN4, its source connected to a ground (GND) and its gate configured to receive a control signal SAEN1.

The operation of the alpha latch type sense amplifier is similar to that of the cross coupled latch sense amplifier. One difference is that the true and complementary data signals from the memory cells are fed to the sense amplifier circuit through the gates of the transistors MN3 and MN4. The control signal SAEN1 is kept at a high logic for causing the transistors MN5, MN3 and MN4 to conduct and thereby passing on the swing generated by the memory cell on the bit lines to the latch and causing a supply voltage VDD and a ground GND voltage to be connected to the latch. The cross coupled latch starts functioning and nodes INP and INN are driven to the supply voltage and the ground voltage, depending on the true and complementary data signals transferred from the memory cells.

Due to an alpha type connection in the alpha latch type sense amplifiers, the input capacitance imposed on the bit lines is less than with the cross coupled latch sense amplifier of FIG. 2. However, the resolution time is poor with this alpha type because of the stack of three transistors as compared to a stack of two transistors in the cross coupled latch type sense amplifier.

It will be noted that the prior art discussed above does not overcome certain major prevailing problems such as: slower read operations, poor resolving time, etc.

Therefore, there is a need for a sense amplifier to provide a high speed read operation with a faster sensing speed for use in SRAM circuits. Moreover, the sense amplifier should provide for a low resolution time.

SUMMARY OF THE INVENTION

In an embodiment, a sense amplifier circuit comprises: a latch circuit having a first inverter circuit cross coupled to a second inverter circuit; a first discharge device operatively coupled to said first inverter circuit; a second discharge device operatively coupled to said second inverter circuit; a first PMOS transistor operatively coupled between said first discharge device and a bit line; a second PMOS transistor operatively coupled between said second discharge device and a complementary bit line; a first NMOS transistor operatively coupled between said first discharge device and a ground voltage; a second NMOS transistor operatively coupled between said second discharge device and the ground voltage; a pull down circuit operatively coupled between said latch circuit and the ground voltage; and a delay circuit operatively coupled among the first PMOS transistor, the second PMOS transistor and said pull down circuit for producing a delay between a first control signal and a second control signal.

In another embodiment, a sense amplifier circuit comprises: a latch circuit having a first inverter circuit cross coupled to a second inverter circuit; a first pull down circuit receiving a first control signal; a second pull down circuit receiving a second control signal; a first discharge device operatively coupled between the first inverter circuit and the first pull down circuit; a second discharge device operatively coupled to the second inverter circuit and the first pull down circuit; a first PMOS transistor operatively coupled between said first discharge device and a bit line; a second PMOS transistor operatively coupled between said second discharge device and a complementary bit line; a first NMOS transistor operatively coupled between said first discharge device and the ground voltage; a second NMOS transistor operatively coupled between said second discharge device and the ground voltage; and a delay circuit operatively coupled among the first PMOS transistor, the second pull down circuit and the first pull down circuit for producing a delay between the first control signal and the second control signal.

In another embodiment, a method comprises: sensing a voltage difference between a bit-line and a complementary bit line; applying a first control signal to enable a pull down circuit for actuating a sense amplifier circuit; applying a second control signal to disable a first PMOS transistor and a second PMOS transistor and enabling a first NMOS transistor and a second NMOS transistor to discharge an input capacitance of a first discharge device and a second discharge device; and generating an output across latch output nodes of the sense amplifier circuit.

In another embodiment, a sense amplifier circuit comprises: a latch circuit having a first inverter circuit cross coupled to a second inverter circuit; a first NMOS discharge transistor whose source and drain are coupled to corresponding source and drain of an NMOS transistor in said first inverter circuit; a second NMOS discharge transistor whose source and drain are coupled to corresponding source and drain of an NMOS transistor in said second inverter circuit; a first PMOS transistor having a drain coupled to a gate of the first NMOS discharge transistor and a source coupled to a bit line; a second PMOS transistor having a source coupled to a gate of the second NMOS discharge transistor and a drain coupled to a complementary bit line; a first NMOS transistor operatively coupled between the gate of said first NMOS discharge transistor and a ground voltage; a second NMOS transistor operatively coupled between the gate of said second NMOS discharge transistor and the ground voltage; a pull down circuit operatively coupled between a common node of said latch circuit and the ground voltage and having a gate receiving a first control signal; and a delay circuit for delaying the first control signal to generate a second control signal for application to gate terminals of each of the first PMOS transistor, second PMOS transistor, first NMOS transistor and second NMOS transistor.

In another embodiment, a sense amplifier circuit comprises: a latch circuit having a first inverter circuit cross coupled to a second inverter circuit; a first NMOS discharge transistor whose drain is coupled to a latch node in said first inverter circuit; a second NMOS discharge transistor whose drain is coupled to a latch node in said second inverter circuit; a first pull down circuit operatively coupled between a common source node of said first and second NMOS discharge transistors and the ground voltage and having a gate receiving a first control signal; a first PMOS transistor having a drain coupled to a gate of the first NMOS discharge transistor and a source coupled to a bit line; a second PMOS transistor having a source coupled to a gate of the second NMOS discharge transistor and a drain coupled to a complementary bit line; a first NMOS transistor operatively coupled between the gate of said first NMOS discharge transistor and a ground voltage; a second NMOS transistor operatively coupled between the gate of said second NMOS discharge transistor and the ground voltage; a second pull down circuit operatively coupled between a common node of said latch circuit and the ground voltage and having a gate receiving a second control signal; and a delay circuit for delaying the first control signal to generate the second control signal for further application to gate terminals of each of the first PMOS transistor, second PMOS transistor, first NMOS transistor and second NMOS transistor.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF THE INVENTION

Figure 1:
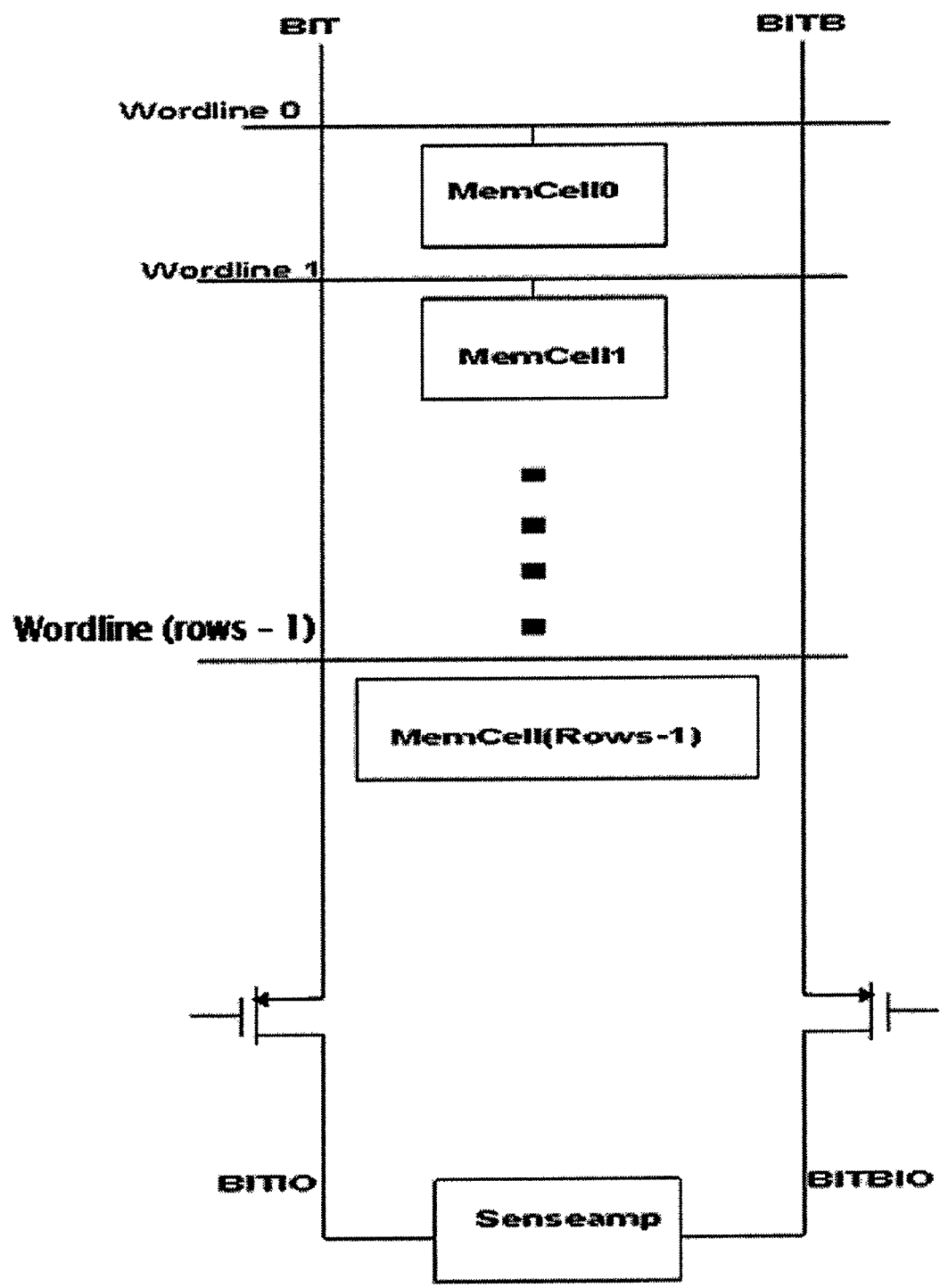
FIG. 1 illustrates a block diagram of a general configuration for an SRAM column.
Figure 2:
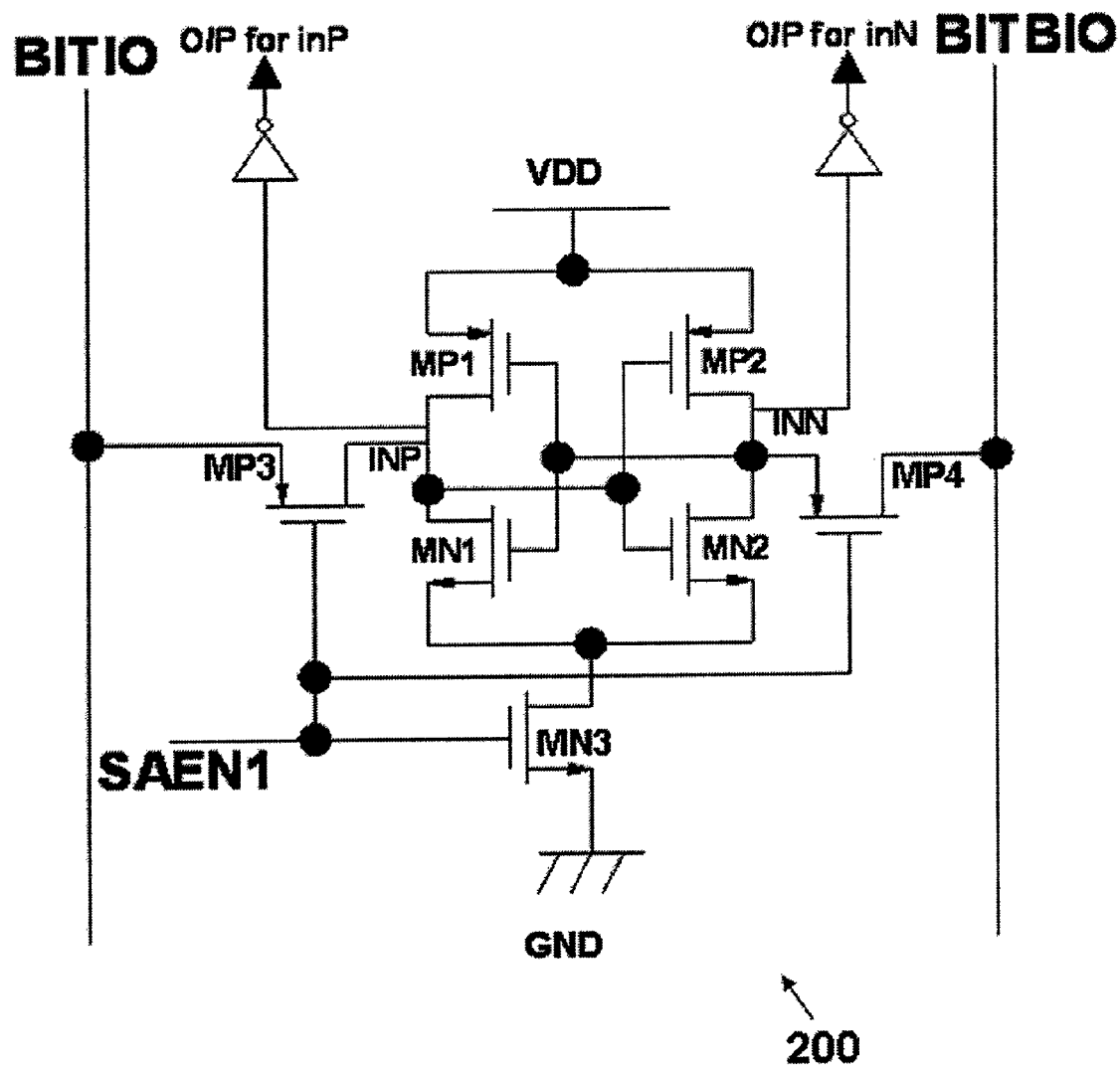
FIG. 2 illustrates a circuit diagram of a conventional cross coupled latch sense amplifier.
Figure 3:
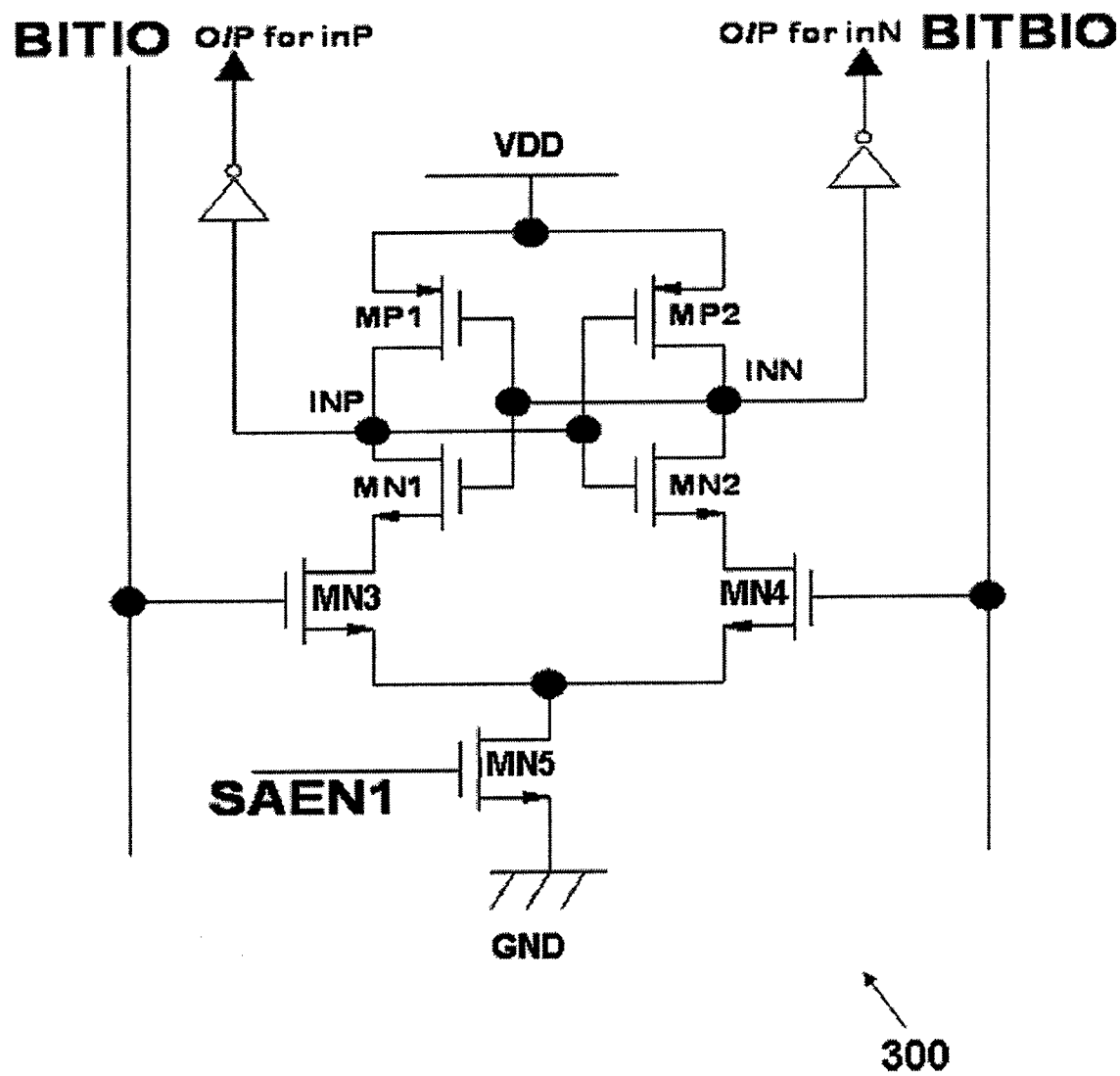
FIG. 3 illustrates a circuit diagram of a conventional alpha latch sense amplifier.

The preferred embodiments will be described in detail with reference to the accompanying drawings. However, the present invention is not limited to the preferred embodiments. The present invention can be modified in various forms. The preferred embodiments are only provided to explain more clearly the present invention to one ordinarily skilled in the art. In the accompanying drawings, like reference numerals are used to indicate like components.

A sense amplifier circuit 400 is presented which provides for high speed sensing with high read operation, with a low capacitance and a low resolution time.

Figure 4:
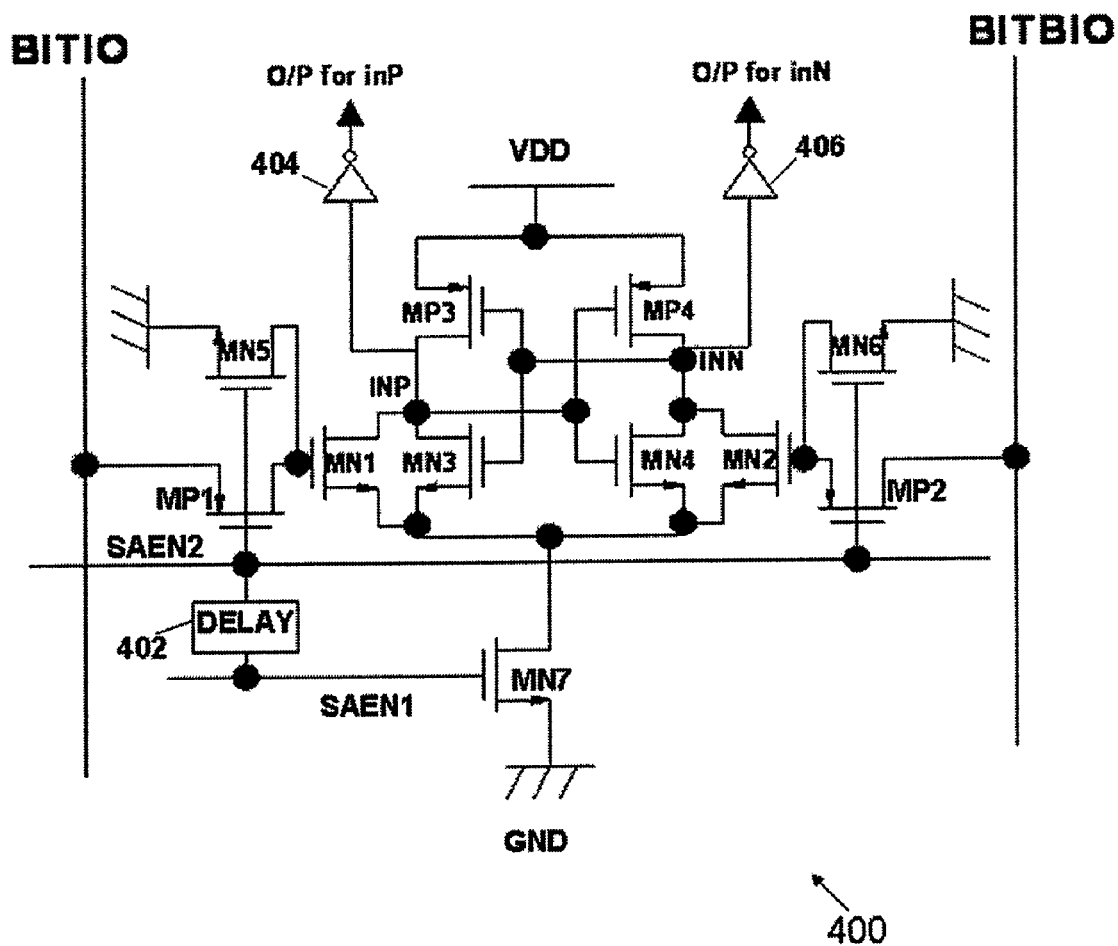
FIG. 4 illustrates a circuit diagram of a gate input latch sense-amplifier according to an embodiment.

FIG. 4 illustrates a circuit diagram of a gate input latch sense amplifier according to one embodiment. A sense amplifier circuit 400 providing a low capacitance with a low resolution time includes a latch circuit, a first discharge device MN1, a second discharge device MN2, a first PMOS transistor MP1, a second PMOS transistor MP2, a first NMOS transistor MN5, a second NMOS transistor MN6, a pull down circuit MN7, a delay circuit 402, a first NOT gate 404, and a second NOT gate 406.

In the embodiment, the latch circuit 400 includes a first inverter circuit and a second inverter circuit cross coupled with each other. The latch circuit is connected to a voltage source VDD. The first discharge device MN1 is operatively coupled to the first inverter circuit and the second discharge device MN2 is operatively coupled to the second inverter circuit. The first discharge device MN1 includes an NMOS transistor having a source and a drain terminal operatively coupled to a corresponding source and a drain terminal of an NMOS transistor MN3 of the first inverter circuit. A gate terminal of the first discharge device MN1 is operatively coupled to a drain terminal of the first PMOS transistor MP1 and the first NMOS transistor MN5.

The second discharge device MN2 includes an NMOS transistor having a source and a drain terminal operatively coupled to a corresponding source and a drain terminal of a NMOS transistor MN4 of the second inverter circuit. A gate terminal of the second discharge device MN2 is operatively coupled to a source terminal of the second PMOS transistor MP2 and to a drain terminal of the second NMOS transistor MN6.

The first PMOS transistor MP1 is operatively coupled between the first discharge device MN1 and a bit line BITIO. The second PMOS transistor MP2 is operatively coupled between the second discharge device MN2 and a complementary bit line BITBIO. The first NMOS transistor MN5 is operatively coupled between said first discharge device MN1 and a ground voltage. The second NMOS transistor MN6 is operatively coupled between said second discharge device MN2 and the ground voltage.

The pull down circuit MN7 is operatively coupled between the latch circuit and the ground voltage. The pull down circuit MN7 includes an NMOS transistor for receiving a first control signal SAEN1 through a gate terminal and a drain terminal is operatively coupled to said latch circuit.

The delay circuit 402 is operatively coupled among the first PMOS transistor MP1, the second PMOS transistor MN2 and the pull down circuit MN7 for producing a delay between the first control signal SAEN1 and the second control signal SAEN2. In an embodiment, the delay circuit 402 can be designed using two invertors in series or any other circuitry which can produce a delay between the control signals. The first PMOS transistor MP1, the first NMOS transistor MN5, the second PMOS transistor MP2 and the second NMOS transistor MN6 receive the second control signal SAEN2 through a gate terminal of the transistors.

The first NOT gate 404 is operatively coupled to a first latch output node INP and the second NOT gate 406 is operatively coupled to a second latch output node INN to provide an output data corresponding to a data stored in a memory cell.

Figure 5:
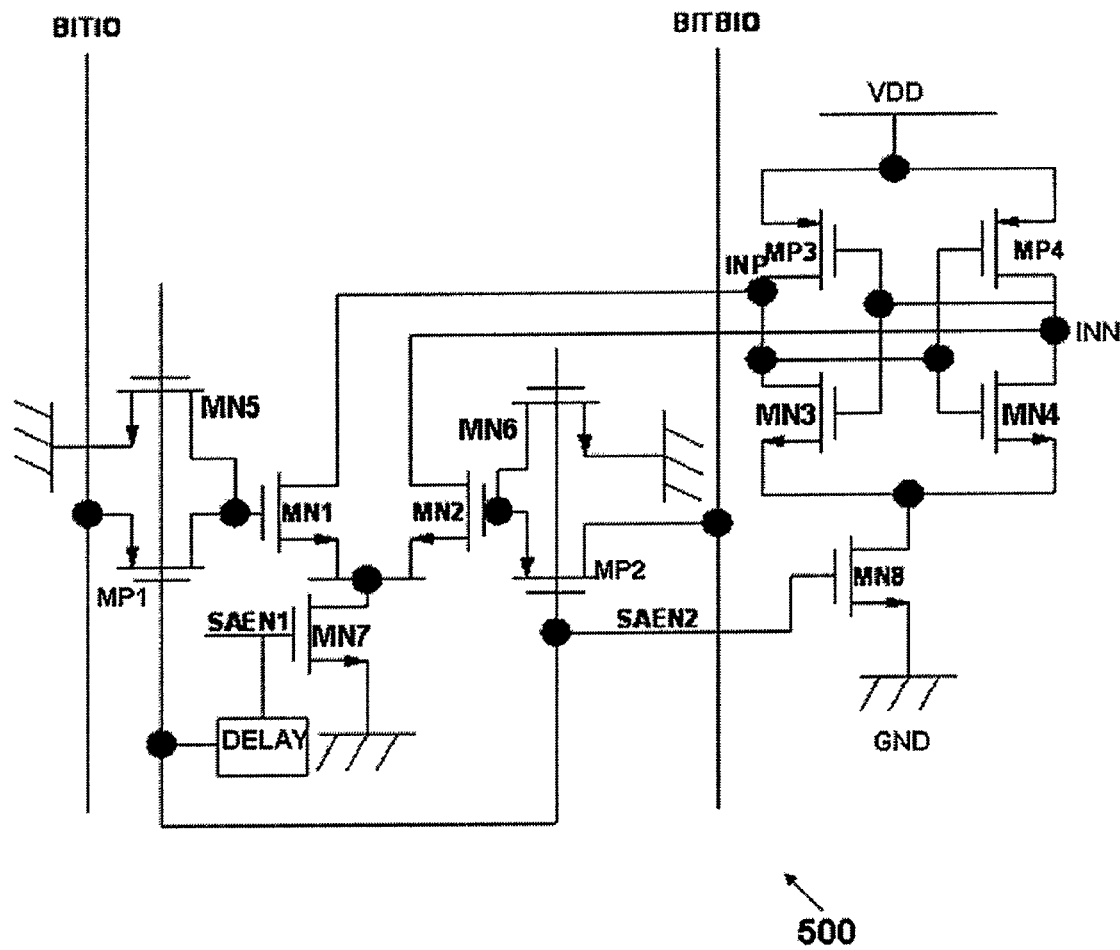
FIG. 5 illustrates a circuit diagram of a two stage sense amplifier according to an embodiment.

FIG. 5 illustrates a circuit diagram of a two stage sense amplifier according to an embodiment. A sense amplifier circuit 500 provides a low capacitance with a low resolution time. The circuit 500 includes a latch circuit, a first pull down circuit MN7, a second pull down circuit MN8, a first discharge device MN1, a second discharge device MN2, a first PMOS transistor MP1, a second PMOS transistor MP2, a first NMOS transistor MN5, a second NMOS transistor MN6, and a delay circuit.

The latch circuit includes a first inverter circuit and a second inverter circuit cross coupled with each other. The latch circuit is coupled to a voltage source VDD. The first pull down circuit MN7 is configured to receive a first control signal SAEN1. The second pull down circuit MN8 is configured to receive a second control signal SAEN2. The first discharge device MN1 is operatively coupled between the first inverter circuit and the first pull down circuit MN7. The second discharge device MN2 is operatively coupled to the second inverter circuit and the first pull down circuit MN7. The first pull down circuit MN7 is operatively coupled between discharge devices MN1, MN2 and a ground voltage. The second pull down circuit MN8 is connected between the latch circuit and the ground voltage. The first pull down circuit MN7 is operatively coupled to a source terminal of discharge devices MN1 and MN2 through a drain terminal, and a source terminal of said first pull down circuit MN7 is operatively coupled to the ground voltage. The first pull down circuit MN7 is provided with the first control signal SAEN1 through a gate terminal. The first PMOS transistor MP1 is operatively coupled between the first discharge device MN1 and a bit line BITIO. The second PMOS transistor MP2 is operatively coupled between said second discharge device MN2 and a complementary bit line BITBIO. The first NMOS transistor MN5 is operatively coupled between said first discharge device MN1 and the ground voltage. The second NMOS transistor MN6 is operatively coupled between said second discharge device MN2 and the ground voltage. The delay circuit is operatively coupled among the first PMOS transistor MP1, the second pull down circuit MN8 and said first pull down circuit MN7 for producing a delay between the first control signal SAEN1 and the second control signal SAEN2 to provide a low capacitance with a low resolution time.

The two configurations of the sense amplifier as illustrated in FIG. 4 and FIG. 5 are very similar in operation, except that in the first configuration (FIG. 4), the pull down transistor (MN7) is shared in the two stages of the sense-amplifier, while in the second configuration (FIG. 5), two different pull down transistors (MN7 and MN8) are used.

When a sufficient voltage difference appears on the bit-lines, the first control signal SAEN1 goes high and the second control signal SAEN2 remains low for a small time interval, as provided by the delay elements in FIG. 4 and FIG. 5. In this time interval delay, the input of the discharging devices MN1 and MN2 is high (with a small voltage difference, greater than or equal to the offset of this sense-amplifier), so both of these will discharge the nodes INP and INN with a current difference with a very fast rate. In this time duration, the transistors MN3 and MN4 will work as in a conventional cross-coupled latch type sense amplifier leading to a creation of further voltage difference at nodes INP and INN. The overall effect of these two transistor pairs will lead to a sufficient voltage difference at nodes INP and INN in the duration of the 'delay', after which the SAEN2 signal goes high and transistors MP1, MP2, MN1 and MN2 are cut-off from the circuit. As SAEN2 signal goes high, the transistors MN5 and MN6 are switched on and discharge the input capacitances of the transistors MN1 and MN2 respectively. After this, the circuit works as an ordinary cross-coupled sense amplifier. The cross-coupled latch consisting of transistors MP3, MP4, MN3 and MN4 quickly resolves the nodes INP and INN, taking one to 0 volts (GND) and the other to the voltage VDD.

Figure 6:
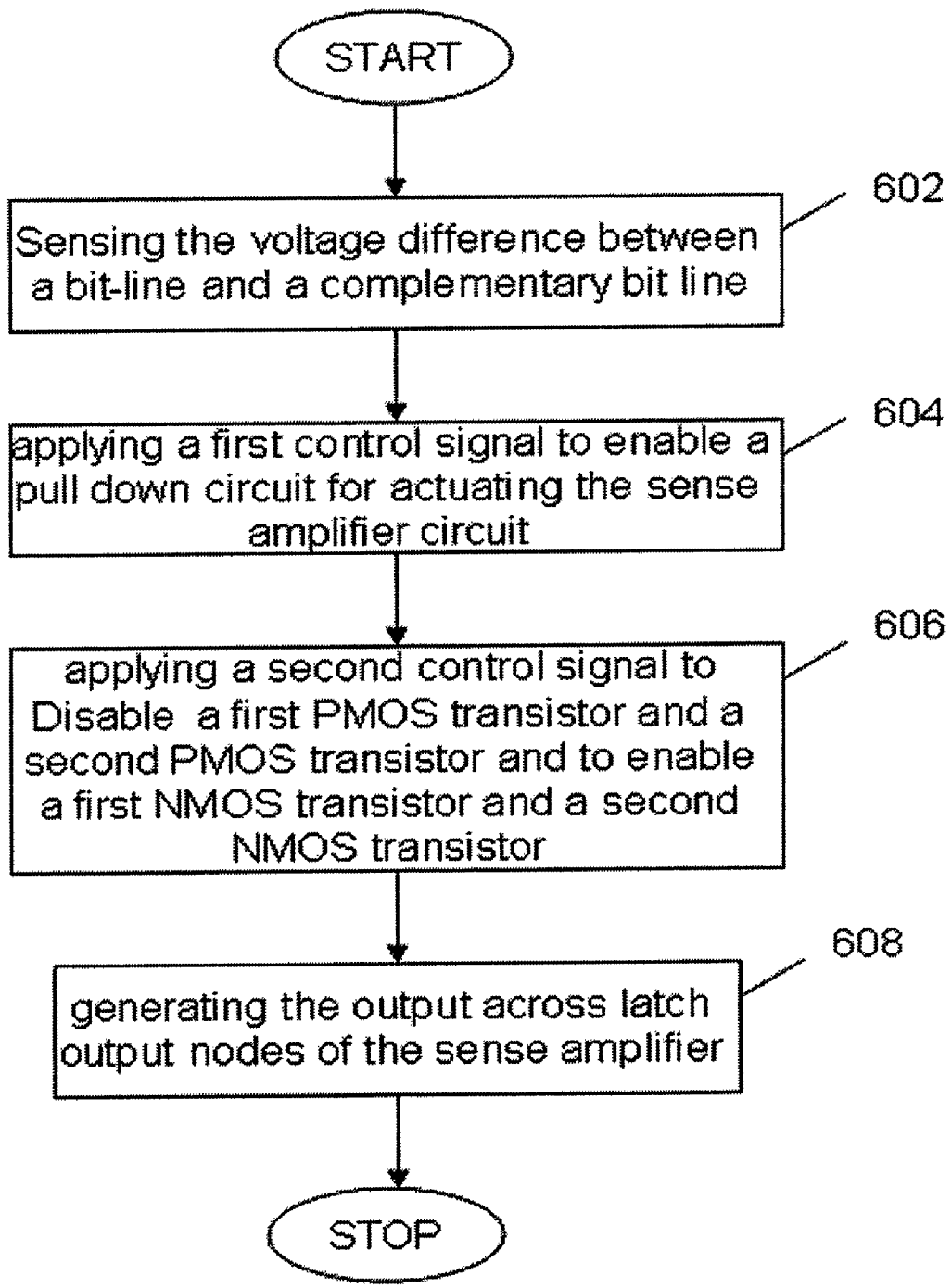
FIG. 6 illustrates a flow diagram of a method for providing a high speed sensing and reading through a sense amplifier circuit according to an embodiment.

FIG. 6 illustrates a flow diagram of a method for providing a high speed sensing and reading through a sense amplifier circuit according to an embodiment. At step 602, a voltage difference is sensed between a bit-line and a complementary bit line. At step 604, a first control signal is applied to enable a pull down circuit for actuating the sense amplifier circuit. At step 606, a second control signal is applied to disable a first PMOS transistor and a second PMOS transistor and to enable a first NMOS transistor and a second NMOS transistor to discharge an input capacitance of a first discharge device and a second discharge device. At step 608, the output is generated across latch output nodes of the sense amplifier.

The embodiments describe a sense amplifier circuit which offers many advantages. Firstly, the sense amplifier provides high speed sensing and reading operations when used in a memory device. Secondly, the amplifier imposes low input capacitance on the bit-lines, which makes them discharge at a much faster rate. Thirdly, the amplifier utilizes a low resolution time.

Although the disclosed of system and method has been described in connection with the embodiments illustrated in the accompanying drawings, it is not limited thereto. It will be apparent to those skilled in the art that various substitutions, modifications and changes may be made thereto without departing from the scope and spirit of the disclosure.

What is claimed:

1. A sense amplifier circuit comprising:
a latch circuit having a first inverter circuit cross coupled to a second inverter circuit;
a first discharge device operatively coupled to a first latch node of said first inverter circuit;
a second discharge device operatively coupled to a second latch node of said second inverter circuit;
a first PMOS transistor operatively coupled between said first discharge device and a bit line;
a second PMOS transistor operatively coupled between said second discharge device and
a complementary bit line;
a first NMOS transistor operatively coupled between said first discharge device and a ground voltage;
a second NMOS transistor operatively coupled between said second discharge device and the ground voltage;
a pull down circuit operatively coupled between a common node of said latch circuit and the ground voltage; and
a delay circuit operatively coupled among the first PMOS transistor, the second PMOS transistor and said pull down circuit for producing a delay between a first control signal and a second control signal.

2. The circuit of claim 1, wherein said first discharge device comprises an NMOS transistor.

3. The circuit of claim 1, wherein said second discharge device comprises an NMOS transistor.

4. The circuit of claim 2, wherein said first discharge device has a source and a drain terminal operatively coupled to a corresponding source and a drain terminal of an NMOS transistor of the first inverter circuit and a gate terminal of the first discharge device is operatively coupled to a drain terminal of the first PMOS and the first NMOS transistor.

5. The circuit of claim 3, wherein said second discharge device has a source and a drain terminal operatively coupled to a corresponding source and a drain terminal of an NMOS transistor of the second inverter circuit and a gate terminal of the second discharge device is operatively coupled to a source terminal of the second PMOS and to a drain terminal of the second NMOS transistor.

6. The circuit of claim 1, wherein said pull down circuit comprises an NMOS transistor.

7. The circuit of claim 1, wherein said pull down circuit has a gate terminal for receiving the first control signal, a drain terminal operatively coupled to said latch circuit, and a source terminal connected to the ground voltage.

8. The circuit of claim 1, wherein said delay circuit delays application of a control signal so that the control signal is first applied to actuate the pull down circuit and then, after the delay, applied to de-actuate the first and second PMOS transistors.

9. The circuit of claim 1, further comprising a first NOT gate operatively coupled to a first latch output node and a second NOT gate operatively coupled to a second latch output node to provide an output data corresponding to a data stored in a memory cell.

10. A sense amplifier circuit comprising:
a latch circuit having a first inverter circuit cross coupled to a second inverter circuit;
a first pull down circuit receiving a first control signal;
a second pull down circuit for the latch circuit receiving a second control signal;
a first discharge device operatively coupled between the first inverter circuit and the first pull down circuit;
a second discharge device operatively coupled to the second inverter circuit and the first pull down circuit;
a first PMOS transistor operatively coupled between said first discharge device and a bit line;
a second PMOS transistor operatively coupled between said second discharge device and a complementary bit line;
a first NMOS transistor operatively coupled between said first discharge device and a ground voltage;
a second NMOS transistor operatively coupled between said second discharge device and the ground voltage; and
a delay circuit operatively coupled among the first PMOS transistor, the second pull down circuit and the first pull down circuit for producing a delay between the first control signal and the second control signal.

11. The circuit of claim 10, wherein said first pull down circuit has a drain terminal operatively coupled to a source terminal of both the first discharge device and the second discharge device, a source terminal connected to the ground voltage and a gate terminal receiving the first control signal.

12. The circuit of claim 10, wherein said first discharge device comprises an NMOS transistor.

13. The circuit of claim 10, wherein said second discharge device comprises an NMOS transistor.

14. The circuit of claim 12, wherein said first discharge device has a drain terminal operatively coupled to a corresponding drain terminal of an NMOS transistor of the first inverter circuit and a gate terminal of the first discharge device is operatively coupled to a drain terminal of the first PMOS and the first NMOS transistor.

15. The circuit of claim 13, wherein said second discharge device has a drain terminal operatively coupled to a corresponding drain terminal of an NMOS transistor of the second inverter circuit and a gate terminal of the second discharge device is operatively coupled to a source terminal of the second PMOS and to a drain terminal of the second NMOS transistor.

16. The circuit of claim 10, wherein the first control signal is applied to a control terminal of the first pull down circuit and the second control signal is applied to a control terminal of the first pull down circuit and also to a gate terminal of each of the first and second PMOS transistors and also to a gate terminal of each of the first and second NMOS transistors.

17. The circuit of claim 10, further comprising a first NOT gate operatively coupled to a first latch output node and a second NOT gate operatively coupled to a second latch output node to provide an output data corresponding to a data stored in a memory cell.

18. A method comprising:
sensing a voltage difference between a bit-line and a complementary bit line;
applying a first control signal to enable a pull down circuit for actuating the sense amplifier circuit;
applying a second control signal to disable a first PMOS transistor and a second PMOS transistor and enabling a first NMOS transistor and a second NMOS transistor to discharge an input capacitance of a first discharge device and a second discharge device; and
generating an output across latch output nodes of the sense amplifier circuit.

19. A sense amplifier circuit comprising:
a latch circuit having a first inverter circuit cross coupled to a second inverter circuit;
a first NMOS discharge transistor whose source and drain are coupled to corresponding source and drain of an NMOS transistor in said first inverter circuit;
a second NMOS discharge transistor whose source and drain are coupled to corresponding source and drain of an NMOS transistor in said second inverter circuit;
a first PMOS transistor having a drain coupled to a gate of the first NMOS discharge transistor and a source coupled to a bit line;
a second PMOS transistor having a source coupled to a gate of the second NMOS discharge transistor and a drain coupled to a complementary bit line;
a first NMOS transistor operatively coupled between the gate of said first NMOS discharge transistor and a ground voltage;
a second NMOS transistor operatively coupled between the gate of said second NMOS discharge transistor and the ground voltage;
a pull down circuit operatively coupled between a common node of said latch circuit and the ground voltage and having a gate receiving a first control signal; and
a delay circuit for delaying the first control signal to generate a second control signal for application to gate terminals of each of the first PMOS transistor, second PMOS transistor, first NMOS transistor and second NMOS transistor.

20. A sense amplifier circuit comprising:
a latch circuit having a first inverter circuit cross coupled to a second inverter circuit;
a first NMOS discharge transistor whose drain is coupled to a latch node in said first inverter circuit;
a second NMOS discharge transistor whose drain is coupled to a latch node in said second inverter circuit;
a first pull down circuit operatively coupled between a common source node of said first and second NMOS discharge transistors and the ground voltage and having a gate receiving a first control signal;
a first PMOS transistor having a drain coupled to a gate of the first NMOS discharge transistor and a source coupled to a bit line;
a second PMOS transistor having a source coupled to a gate of the second NMOS discharge transistor and a drain coupled to a complementary bit line;
a first NMOS transistor operatively coupled between the gate of said first NMOS discharge transistor and a ground voltage;
a second NMOS transistor operatively coupled between the gate of said second NMOS discharge transistor and the ground voltage;
a second pull down circuit operatively coupled between a common node of said latch circuit and the ground voltage and having a gate receiving a second control signal; and
a delay circuit for delaying the first control signal to generate the second control signal for further application to gate terminals of each of the first PMOS transistor, second PMOS transistor, first NMOS transistor and second NMOS transistor.

* * * * *